US008497161B2

(12) United States Patent  (10) Patent No.: US 8,497,161 B2
Yang  (45) Date of Patent: Jul. 30, 2013

(54) METHOD FOR PROVIDING AN LED CHIP WITH A PERIPHERAL PROTECTIVE FILM BEFORE CUTTING THE SAME FROM A WAFER

(76) Inventor: Chiu Chung Yang, Taichung (TW)

( * ) Notice: Subject to any disclaimer, the term of this patent is extended or adjusted under 35 U.S.C. 154(b) by 718 days.

(21) Appl. No.: 12/383,447

(22) Filed: Mar. 24, 2009

(65) Prior Publication Data

US 2009/0186448 A1   Jul. 23, 2009

Related U.S. Application Data

(63) Continuation-in-part of application No. 11/633,608, filed on Dec. 4, 2006, now abandoned.

(51) Int. Cl.
*H01L 21/00*  (2006.01)

(52) U.S. Cl.
USPC .......................................... 438/114; 257/100

(58) Field of Classification Search
USPC ....................... 438/33, 42, 114, 465
See application file for complete search history.

(56) References Cited

U.S. PATENT DOCUMENTS

| 6,946,683 | B2 | 9/2005 | Sano et al. | |
| 2004/0121562 | A1* | 6/2004 | Wakui et al. | 438/465 |
| 2007/0173036 | A1* | 7/2007 | Kusunoki | 438/465 |
| 2008/0261341 | A1* | 10/2008 | Zimmerman et al. | 438/33 |

* cited by examiner

*Primary Examiner* — Jenny L Wagner
*Assistant Examiner* — Mark Tornow

(57) ABSTRACT

A method is disclosed to divide a wafer into chips. In the method, a substrate is provided. The substrate is made of an isolating material. An epitaxial laminate is provided on the substrate. At least one slit is made through the epitaxial laminate completely to form at least two chips connected to each other by the substrate only so that each of the chips includes a portion of the substrate and a portion of the epitaxial laminate. Positive and negative electrodes are formed in each of the chips. An upper protective film is provided to cover an upper side of each of the chips except the electrodes. A peripheral protective film is provided into the slit to cover the periphery of the portion of the epitaxial laminate of each of the chips. Finally, the chips are separated from each other.

1 Claim, 9 Drawing Sheets

METHOD FOR PROVIDING AN LED CHIP WITH A PERIPHERAL PROTECTIVE FILM BEFORE CUTTING THE SAME FROM A WAFER

CROSS-REFERENCE

The present application is a continuation-in-part application of patent application Ser. No. 11/633,608 filed Dec. 4, 2006 now abandoned of which the entire disclosure is incorporated herein for reference.

FIELD OF INVENTION

The present invention relates to a method for dividing a wafer into light-emitting diode ("LED") chips and, more particularly, to a method for providing an LED chip with a peripheral protective film in addition to an upper protective film before cutting the same from a wafer.

BACKGROUND OF INVENTION

Generally, a plurality of LED-related areas is formed on a wafer in a wafer-forming process. Each of the LED-related areas is provided with two electrodes for example. Conventionally, the wafer is subjected to a cutting process so that the LED-related areas are separated from one another and become individual LED chips. Each of the LED chips includes an upper side on which the electrodes are formed and a periphery. Each of the LED chips is subjected to a packaging process so that it is sealed with a protective film except the electrodes. That is, the periphery and the upper side except the electrodes are covered with the protective film. For use, the electrodes of the LED are connected to a printed circuit board for example.

As disclosed in U.S. Pat. No. 6,946,683, a wafer is divided into a plurality of LED chips in a cutting process. Each of the LED chips is formed with an epitaxial layer 11, a conductive layer 13, an isolating layer 4, a first terminal 3, a semiconductor 2 and a second terminal 6. Then, an upper side of the semiconductor 2 is covered with a protective film, and a periphery of the semiconductor 2 is covered with another protective film. The provision of the protective films is conducted in a packaging process after the cutting process. Although not addressed, a periphery of the conductive layer 13 must be covered with another protective film in another packaging process before each of the LED chips can be used. Obviously, it requires a wafer-forming process, a cutting process and at least one packaging process before an LED chip can be used, and this is complicated and expensive.

According to U.S. Patent Publication No. 2004/0121562 A1, FIG. 5, a substrate 10 includes semiconductor elements formed thereon. Internal wiring 24 is formed across a boundary between adjacent semiconductor elements. An oxide film is formed between the substrate 10 and the internal wiring 24. The internal wiring 24 is connected to the semiconductor elements via contact holes (S10). The semiconductor substrate 10 is sandwiched between an upper carrier 2 and a lower carrier 3. Resin layers 5 are located between the substrate 10 and the upper carrier 2, while other resin layers 5 are located between the substrate 10 and the carrier 3, thus forming a laminated structure 100 (S12). At this step, the substrate 10 is etched from the lower carrier 3 along a scribe line to temporarily expose the internal wiring 24 before laminating the lower carrier 3 onto the substrate 10. Buffer members 30 are formed on the lower carrier 3. The buffer members 30 serve as cushions for relieving stress applied to the ball-shaped terminals 8. Then, a notch 22 is created in the laminated structure 100 from the lower carrier 3 along the scribe line using a dicing saw 34, as shown in FIG. 6, to expose end portions 26 of the internal wiring 24 of the elements to a side of the notch 22 (S14). A metal film 28 is formed on the lower carrier member 3 and the internal surface of the notch 22 (S16) so that the metal film 28 contacts the internal wiring 24. The metal film 28 is patterned according to a predetermined wiring pattern to form external wiring lines 7 that extend from the internal wiring 24 to the buffer members 30 (S18). A protection film 32 and ball-shaped terminals 8 are formed (S19, S20). Finally, the laminated structure 100 is divided along the scribe line to produce individual semiconductor devices packaged in a chip size package (S22). The spirit is providing a coolant during the use of the saw. However, end portions of the external wiring 7 are not covered with any protective film. A protective film must be provided to cover the end portions of the external wiring 7 after the cutting, and this is complicated and expensive.

Therefore, the present invention has arisen to mitigate and/or obviate the afore-described disadvantages of the conventional methods.

SUMMARY OF INVENTION

The primary objective of the present invention is to provide to a method for providing an LED chip with a peripheral protective film in addition to an upper protective film before cutting the same from a wafer.

To achieve the foregoing objective, a substrate is provided. The substrate is made of an isolating material. An epitaxial laminate is provided on the substrate. At least one slit is made through the epitaxial laminate completely to form at least two chips connected to each other by the substrate only so that each of the chips includes a portion of the substrate and a portion of the epitaxial laminate. Positive and negative electrodes are formed in each of the chips. An upper protective film is provided on an upper side of each of the chips except the electrodes. A peripheral protective film is provided into the slit to cover the periphery of the portion of the epitaxial laminate of each of the chips. Finally, the chips are separated from each other.

Further objectives and advantages of the present invention will become apparent from a careful reading of the detailed description provided hereinafter, with appropriate reference to the accompanying drawings.

BRIEF DESCRIPTION OF DRAWINGS

The present invention will be described via detailed illustration of two embodiments referring to the attached drawings, wherein.

DETAILED DESCRIPTION OF EMBODIMENTS

Figure 1:
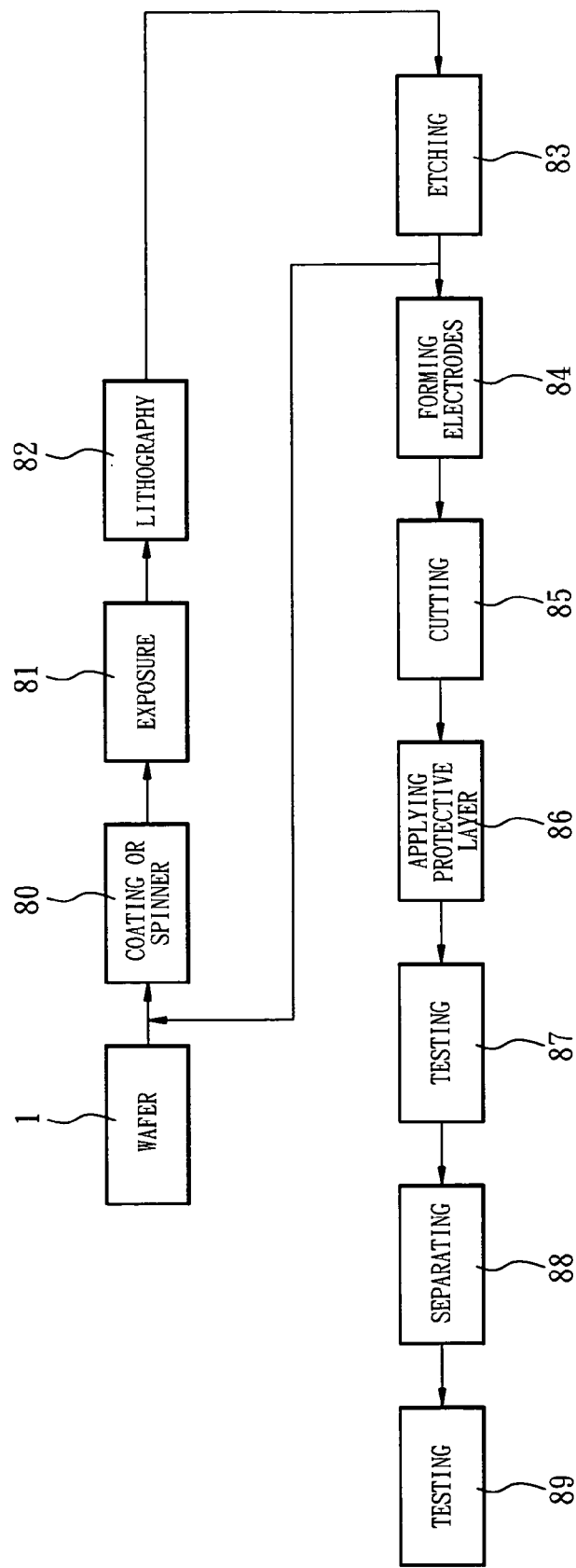
FIG. 1 is a flow chart of a method for making LED chips in accordance with a first embodiment of the present invention.
Figure 2:
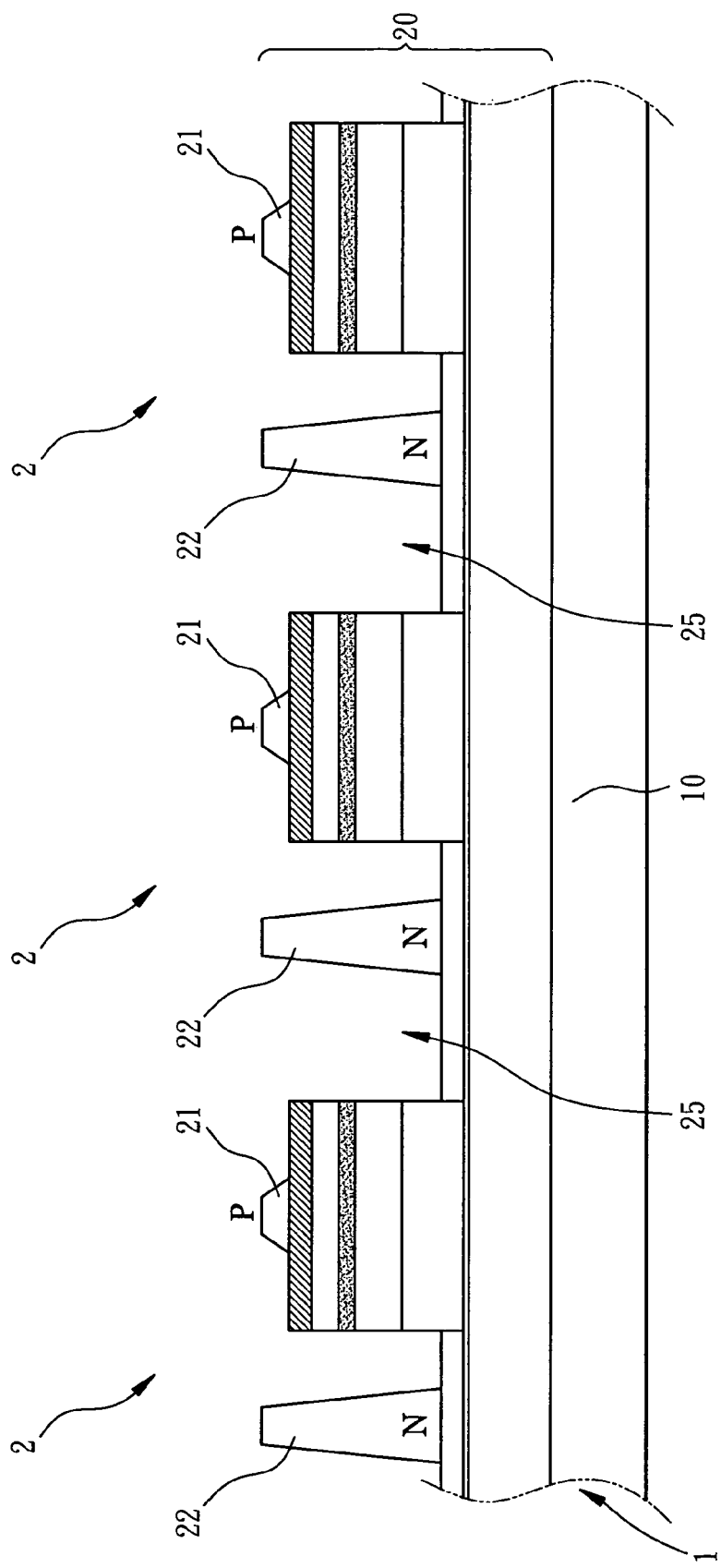
FIGS. 2, 3, 4 and 5 are cross-sectional partial views of a wafer at various steps in the method shown in FIG. 1.

Referring to FIGS. 1 and 2, there is shown a method for making LED chips according to a first embodiment of the present invention. There is provided a wafer 1. To make the wafer 1, a substrate 10 is provided. The substrate 10 is made of an isolating material so that there is no risk of leakage of electricity through it. An epitaxial or semiconductor laminate 20 is provided on the substrate 10. The epitaxial laminate 20 includes a plain upper side when it is initially provided on the substrate 10. The epitaxial laminate 20 consists of a plurality of layers of different materials. The exact number of the layers depends on the functionality envisaged for the epitaxial laminate 20.

The wafer 1 is subjected to a coating or spinner step 80, an exposure step 81, a lithography step 82 and/or an etching step 83 for example. Thus, slits 25 are made in an upper portion of the epitaxial laminate 20, to divide the upper portion of the epitaxial laminate 20 into LED chips 2. Each of the LED chips 2 includes a stepped upper side. Up to now, the slits 25 are only made in the upper portion of the epitaxial laminate 20 so that the LED chips 2 are still interconnected. At an electrode-forming step 84, a positive electrode (P) 21 and a negative electrode (N) 22 are provided on the upper side of each of the LED chips 2. The coating or spinner step 80, the exposure step 81, the lithography step 82, the etching step 83 and the electrode-forming step 84 will not be described in detail for being conventional and not the spirit of the present invention. The coating step 80, the exposure step 81, the lithography step 82 and the etching step 83 are conventional and hence will not be described in detail.

Figure 3:
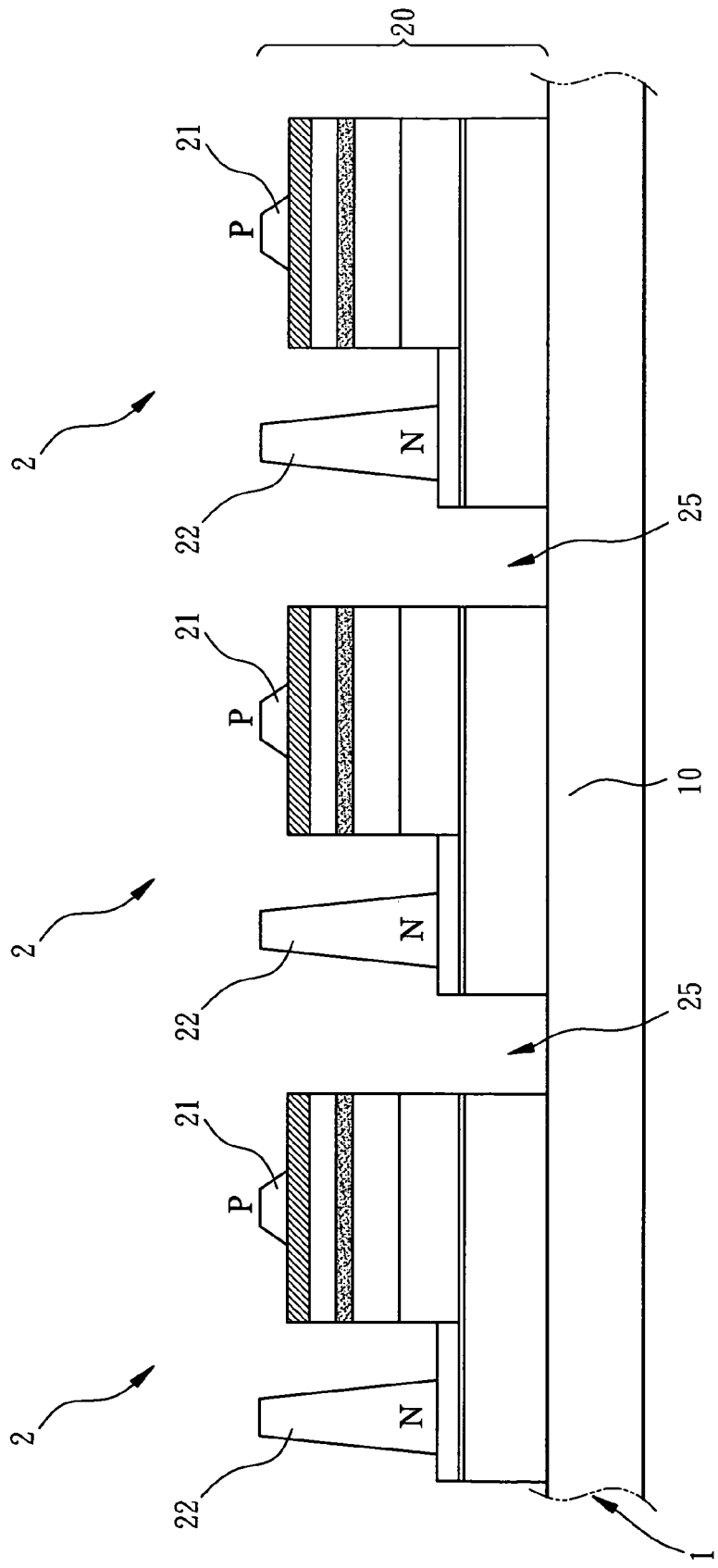

Referring to FIG. 3, the epitaxial laminate 20 is subjected to a cutting step 85 to make the slits 25 deeper, i.e., completely through the epitaxial laminate 20 for allowing the LED chips 2 to be easily separated from each other. The LED chips 2 are almost completely separated from one another except sharing the substrate 10 with one another.

Figure 4:
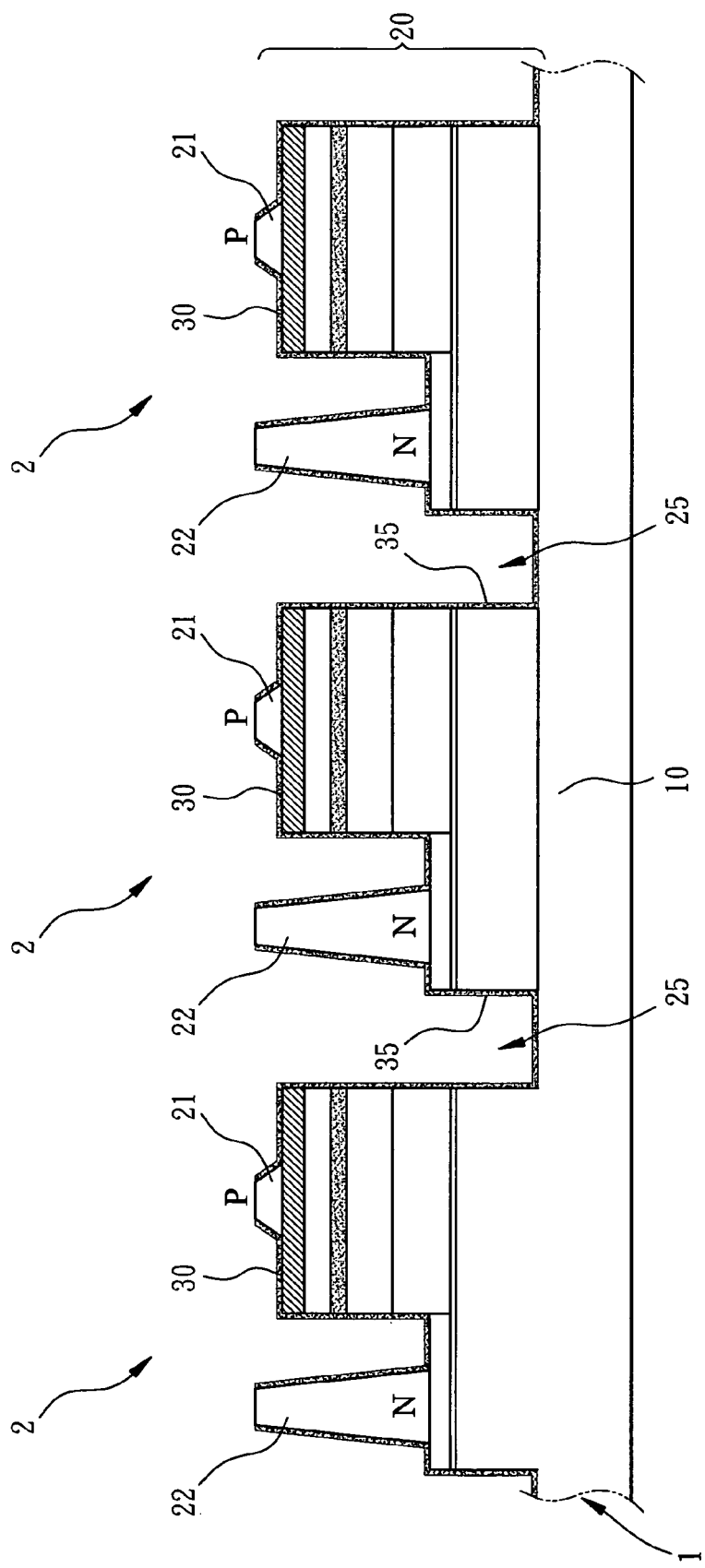

Referring to FIG. 4, the LED chips 2 are subjected to a protective film-applying step 86. An upper protective film 30 and peripheral protective films 35 are provided on the LED chips 2. The upper protective film 30 covers an upper side of the LED chips 2 except the electrodes 21 and 22. The peripheral protective films 35 are disposed in the slits 25 so that each of the peripheral protective films 35 covers the periphery of a portion of the epitaxial laminate 20 related to each of the LED chips 2. Moreover, the peripheral protective films 35 cover the beds of the slit 25, i.e., areas of an upper side of the substrate 10 located within the slits 25. Therefore, the Led chips are properly protected with the upper protective film 30 and the peripheral protective films 35.

Figure 5:
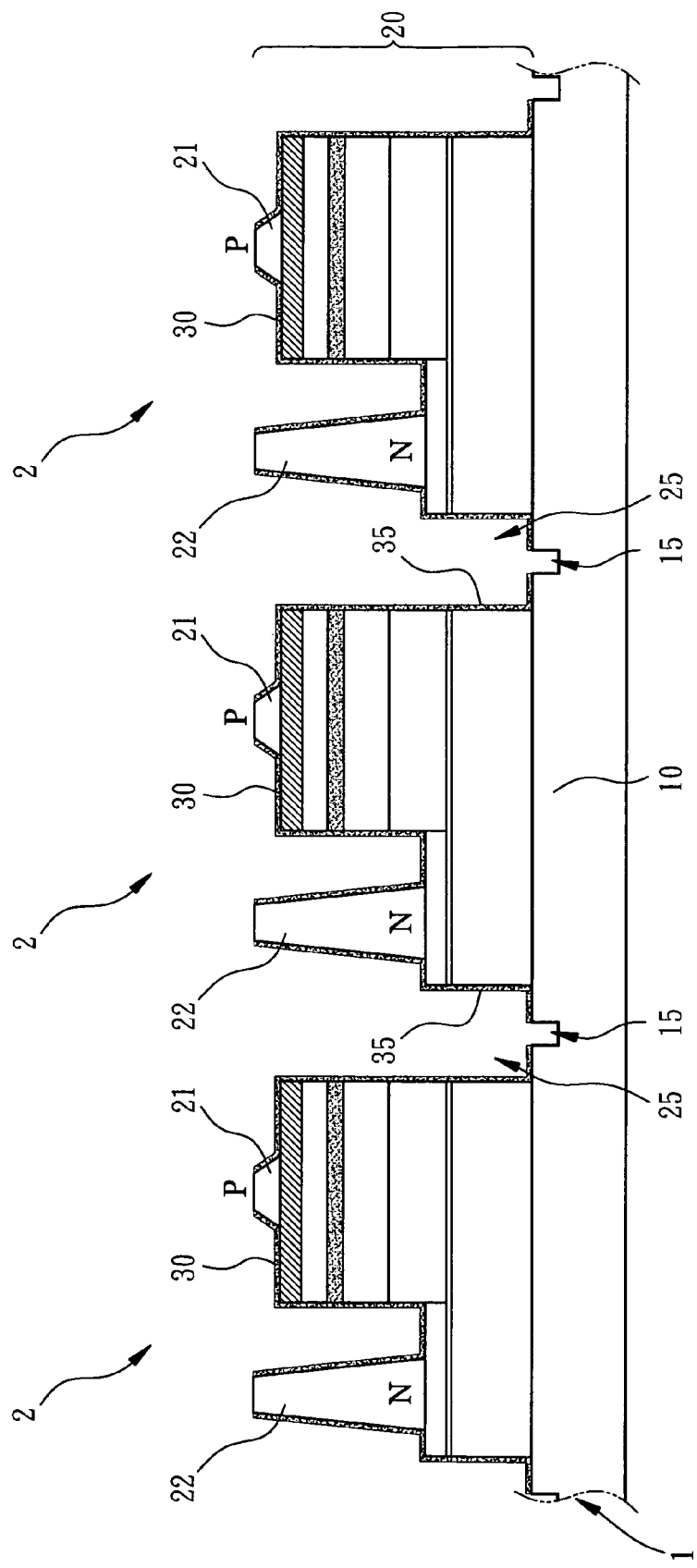

Referring to FIG. 5, the substrate 10 is subjected to a cutting step 88 to make notches 15 into the portions of the substrate 10 located within the slits 25. The notches 15 are in communication with the slits 25 for allowing the substrate 10 to be easily bent and broken along the notches 15 and for allowing the LED chips 2 to be completely separated from one another to form the individual LED chips 2 such as the one shown in FIG. 6.

Figure 6:
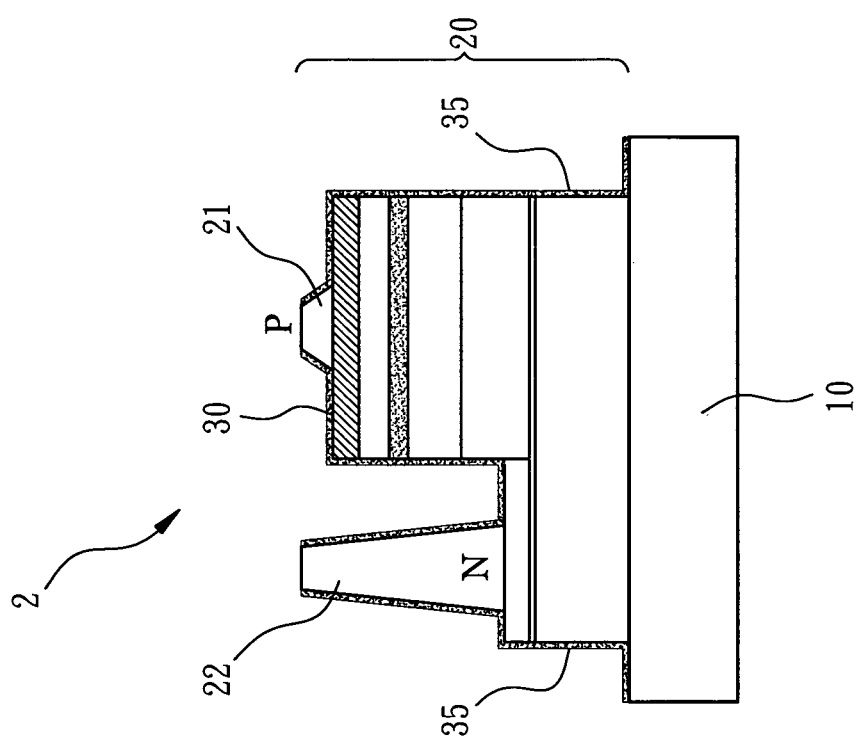
FIG. 6 is a cross-sectional view of an LED chip made in the process shown in FIG. 1.

As clearly shown in FIGS. 5 and 6, the upper protective film 30 and the peripheral protective films 35 are respectively provided on top of and around each of the LED chips 2 including a portion of the epitaxial laminate 20. Thus, the LED chips 2 are prevented from being wetted or damaged by humidity, prevented from being oxidized or rusted, and prevented from electric contact with the other electrical elements. The protective films 30 and 35 can be made of any transparent or translucent and non-conductive or insulated materials. The individual LED chips 2 may be subjected to another testing step 89 to determine whether the LED chips 2 work well or not. Then, the LED chips 2 may directly be attached to printed circuit boards (not shown) without any additional sealing or packaging processes. Therefore, the cost of the LED chips 2 is lower than the cost of an LED chip that requires an additional packaging process after it is cut from a wafer.

Figure 7:
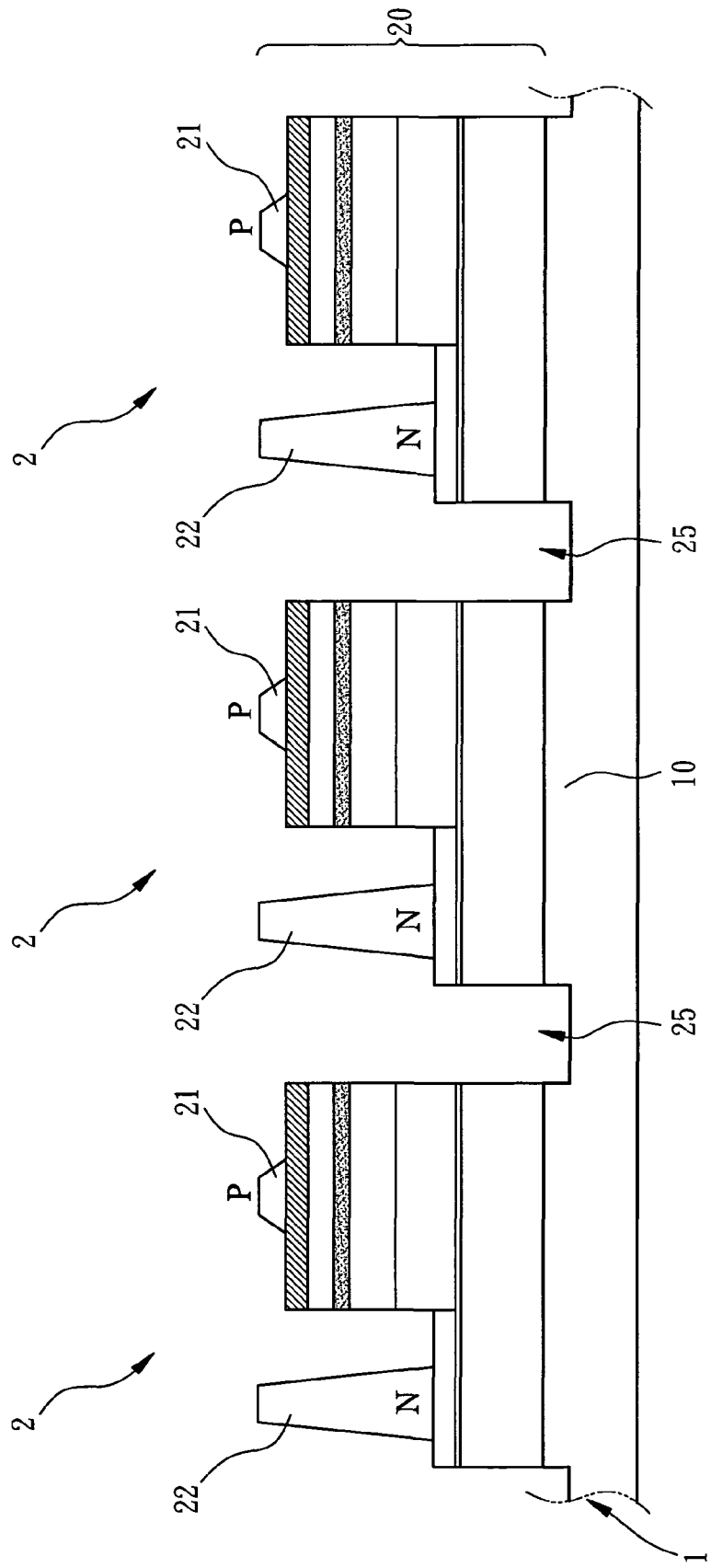
FIGS. 7 and 8 are cross-sectional partial views of a wafer at various steps in a method for making LED chips according to a second embodiment of the present invention.
Figure 8:
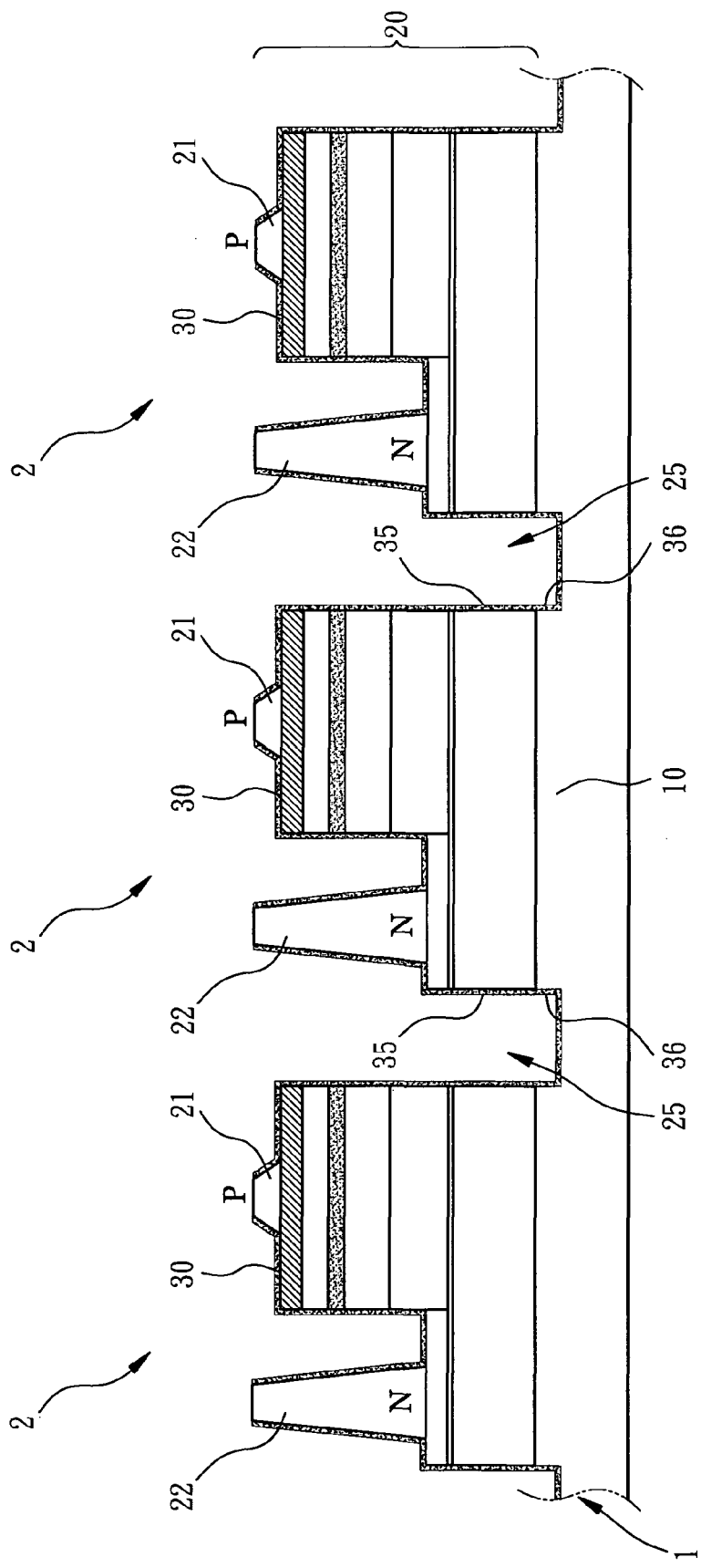

Referring to FIGS. 7 and 8, a method according to a second embodiment of the present invention will be described. In the cutting step 85, the slits 25 are made through the epitaxial laminate 20 and into the substrate 10. In addition to the upper protective film 30 and the peripheral protective films 35, there are provided extensive protective films 36 extended from the peripheral protective films 35. The extensive protective films 36 cover the beds and walls of the slits 25 located within the substrate 10. Thus, without having to make the notches 15 required in the first embodiment, the substrate 10 can easily be broken along the slits 25 by bending or cutting, i.e., the LED chips 2 are separated from one another and become individual LED chips 2 such as the one shown in FIG. 9. Like in the first embodiment, the LED chips 2 are completely protected with the upper protective film 30, the peripheral protective films 35 and the extensive protective films 36 without requiring an additional packaging process. The protection of the LED chips 2 with the extensive protective films 36 in addition to the upper protective film 30 and the peripheral protective films 35 in the second embodiment is believed to be better than the protection of the LED chips 2 with the upper protective film 30 and the peripheral protective films 35 only in the first embodiment. The second embodiment is otherwise identical to the first embodiment.

Figure 9:
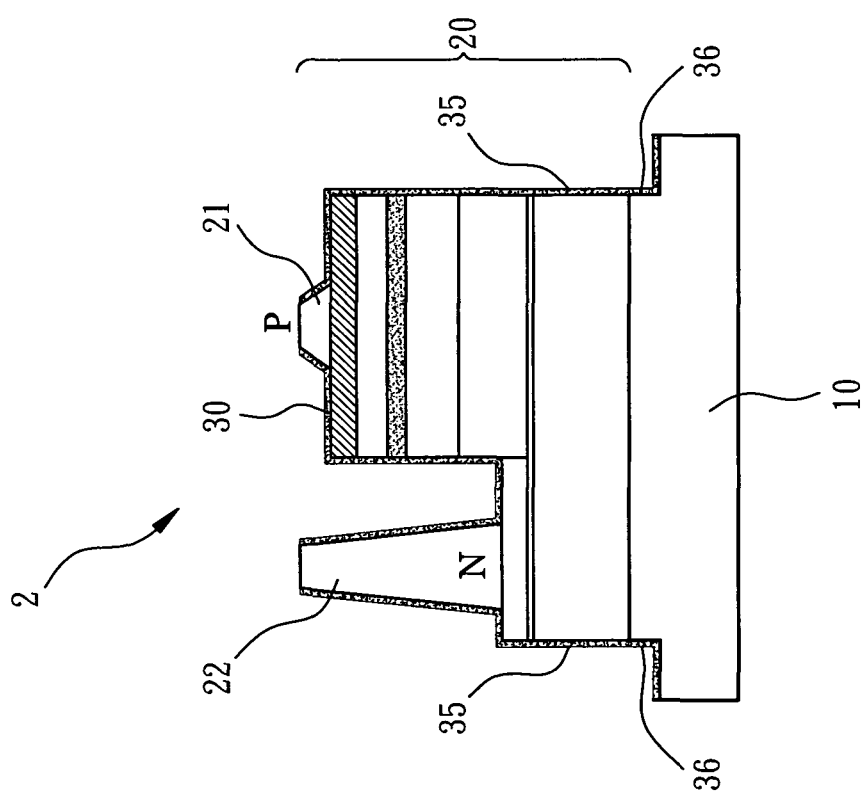
FIG. 9 is a cross-sectional view of an LED chip made in the process according to the second embodiment of the present invention.

Similarly, as shown in FIGS. 8 and 9, the upper protective film 30 and the peripheral protective films are respectively provided on top of and around each of the LED chips 2 including a portion of the epitaxial laminate 20. Thus, the LED chips 2 are prevented from being wetted or damaged by humidity, prevented from being oxidized or rusted, and prevented from electric contact with the other electrical elements. The protective film 30 and 35 can be made of any transparent or translucent and non-conductive or insulated materials. The individual LED chips 2 may be subjected to another testing step 89 to determine whether the LED chips 2 work well or not. Then, the LED chips 2 may directly be attached to circuit boards (not shown) without any additional sealing or packaging processes. Therefore, the cost of the LED chips 2 is lower than the cost of an LED chip that requires an additional packaging process after it is cut from a wafer.

Accordingly, the wafer-dividing method in accordance with the present invention may be used for dividing a wafer into LED chips and for protecting the LED chips from being wetted or damaged by humidity.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A method for forming chips on a wafer, the method comprising:
   providing a substrate;
   providing a plurality of semiconductor layers on the substrate;
   making at least one slit through a portion of the plurality of semiconductor layers to form at least two chips;
   forming positive and negative electrodes on each of the chips;
   extending the at least one slit completely through the plurality of semiconductor layers and into the substrate so that the at least two chips are connected to each other only by the substrate, each of the chips comprising a portion of the substrate and a portion of the plurality of semiconductor layers;

applying an upper protective film on an upper side of each of the chips except the electrodes and a peripheral protective film into the slit to cover the periphery of the portion on the plurality of semiconductor layers of a related at least one of the chips;

providing an extensive protective film extending from the peripheral protective film and in direct contact with the substrate to cover a bed and sidewalls of the at least one slit located within the substrate; and separating the chips from each other.

* * * * *